BIPOLAR TO TWO-LEVEL BINARY CODE TRANSLATOR

Filed Sept. 6, 1966

INVENTOR,
THOMAS J. KESOLITS.
BY Harry M. Saragovitz
Edward J. Kelly, Herbert Berl
& Julian C. Keppler
ATTORNEYS United States Patent Office 3,434,059

Patented Mar. 18, 1969

3,434,059

BIPOLAR TO TWO-LEVEL BINARY CODE TRANSLATOR

Thomas J. Kesolits, East Newark, N.J., assignor to the United States of America as represented by the Secretary of the Army Filed Sept. 6, 1966, Ser. No. 577,540
U.S. Cl. 328—117 4 Claims
Int. Cl. H03k 5/20

ABSTRACT OF THE DISCLOSURE

The circuit includes a pair of Schmitt triggers, one connected directly to the input bipolar binary signal and the other thereto via an inverter. The trigger circuits are arranged to be in a one stable state with positive input and in another state with zero or negative inputs. The two trigger circuit outputs are then combined to form a two-level binary signal containing the same information as the original bipolar signal.

The present invention relates to code translators and more particularly to novel and useful circuitry for converting binary bipolar code to two-level binary code. In transmitting binary data it is often advantageous to convert the data to a bipolar form in which all binary numbers of one type, for example 1's, are represented by a half cycle of a sine wave and all the binary numbers of the other type, for example 0's are represented by zero voltage and in which the polarity of the sine wave half cycles is alternately positive and negative. This type of code is useful for transmission because it has no DC component and also requires a small bandwidth. Most computers and other data processing equipment, in which the code is utilized after transmission, are designed to accommodate only the conventional two-level binary code in which each of the binary numbers is represented by a different DC voltage level. Thus at the receiving terminal some means must be provided for translating from bipolar to two-level form. The present invention provides novel and simple means for accomplishing such translation. Briefly stated, the circuitry comprises a pair of Schmitt trigger circuits both arranged to be in a first stable state with positive input voltages and in a second stable state with zero or negative inputs. The bipolar signal is connected directly to one trigger circuit and to the other trigger circuit via an inverter. Thus the 1's represented by the positive half sine waves trigger said one trigger circuit and the 1's represented by the negative half sine waves trigger said other trigger circuit. The two trigger circuit outputs are then combined to form a two-level binary signal containing the same information as the original bipolar signal. The circuitry includes means for isolating the two trigger circuit outputs from one another. Optionally, a third trigger circuit may be connected to the output of the combining means to provide a noise or interference elimination means.

It is thus an object of the invention to provide a novel and useful code translation circuit.

Another object of the invention is to provide a simplified bipolar to two-level binary code translating means.

Figure 1:
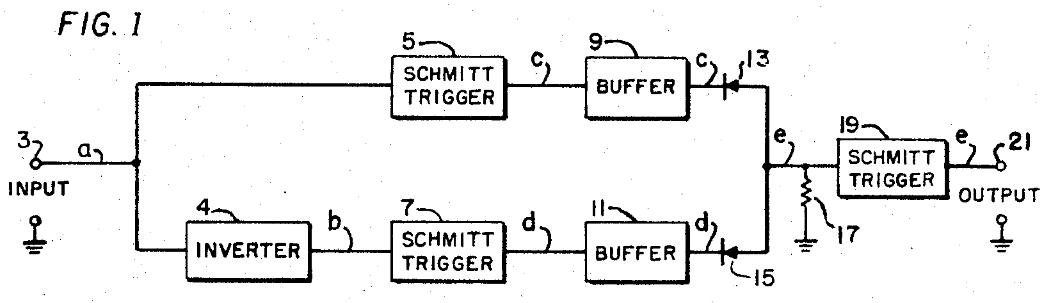
Figure 2:
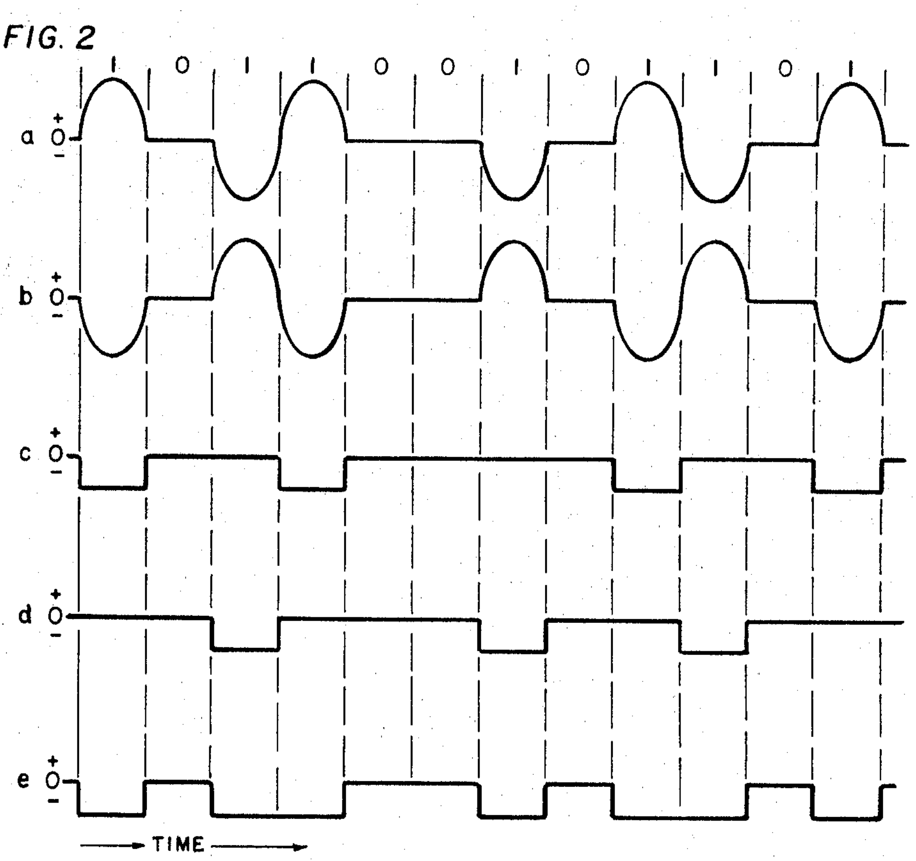

These and other objects and advantages of the invention will become apparent from the following detailed description and drawing, in which:

FIG. 1 is circuit diagram of one embodiment of the invention and FIG. 2 is a series of waveforms illustrating the operation of the circuit, the letter designations of FIG. 1 corresponding to the similarly lettered waveforms of FIG. 2.

In FIG. 1 the bipolar binary code, such as illustrated in FIG. 2*a*, is applied to the translator via input terminals 3. Terminals 3 are directly connected to a first Schmitt trigger circuit 5 and to a second similar trigger circuit 7 via an inverter 4. Buffer circuits 9 and 11, connected to the outputs of each of the trigger circuits, serve to isolate the trigger circuits from the rest of the circuitry. These buffer circuits may comprise emitter followers which provide good isolation or buffering and do not invert the signal. The outputs of the buffer circuits 9 and 11 are applied to combining resistor 17 via diodes 13 and 15. The diodes, with the polarity shown, will prevent negative pulses from either of the buffer circuits from leaking back into the output circuit of the other buffer circuit. A third Schmitt trigger circuit 19 has as its input the combined outputs of the first and second trigger circuits. The output of trigger circuit 19 comprises the two-level binary output signal of the translator.

FIG. 1*a* illustrates a typical train of bipolar data which may be applied to the input terminals 3. The binary value of each time slot or baud is indicated above this waveform. As stated above, a 1 is represented by either a negative or positive half sine wave and a zero by zero voltage, with alternate 1's of the opposite polarity. The output of the inverter 4 is shown in waveform *b*. As is known, a Schmitt trigger is a bistable device which will switch from a first to a second stable state if its input voltage exceeds a certain threshold value and will switch back to the first stable state if its input falls below the threshold value. The two trigger circuits 5 and 7 are both designed to have threshold voltages of substantially zero but slightly positive so that each trigger circuit will be in its first stable state if its input is more than slightly positive and will be in its second stable state if its input is zero or negative. Since the input of trigger circuit 7 is the inverse or complement of that of trigger circuit 5, only the positive half sine waves in the translator input of waveform *a* will cause trigger circuit 5 to switch to its first stable state, and only the negative half sine waves of waveform *a* will cause trigger circuit 7 to switch to its first stable state. Both trigger circuits 5 and 7 are designed to produce the same polarity output in corresponding stable states, and in the illustrative embodiment both circuits produce zero output voltage when in the second stable state and a negative voltage when in the first stable state. The outputs of trigger circuits 5 and 7 are shown respectively in waveforms *c* and *d*. Assuming that the buffer circuits 9 and 11 do not invert the signal, the outputs of these circuits would also be the same as their inputs, as shown in the letters *c* and *d* at the outputs thereof. Since the combining resistor 17 is connected to the outputs of both buffer circuits, a voltage will be developed across this resistor whenever either of the buffer circuits produces an output. This voltage is indicated in waveform *e*. It can be seen that this waveform is zero whenever a 0 binary number appears in the original bipolar signal of waveform *a* and negative whenever a 1 appears therein. Thus the bipolar binary code has been translated to a two-level binary code. The purpose of the diodes 13 and 15 was mentioned above. In the event that the outputs of the buffer circuits are positive rather than negative as in the illustrative circuitry, the polarity of both diodes would be reversed, that is, both diode cathodes would be connected to the combining resistor 17. The third Schmitt trigger circuit is designed to have a threshold voltage approximately half way between the nominal values of the two voltage levels across the combining resistor 17. Thus if the two levels of the waveform *e* are zero and minus 5 volts, the trigger 19 would be designed to trigger at approximately minus 2.5 volts. Thus noise impulses of amplitude less than 2.5 volts superimposed on the signal across resistor 17 will not trigger circuit 19 and will not appear at the output terminal 21 thereof. The output voltage at terminal 21 can be a replica of that across resistor 17 or may be the complement thereof, depending on which side of the Schmitt trigger 19 the terminal 21 is connected to.

While the invention has been shown and described in connection with an illustrative embodiment, the novel concepts embodied therein are of general application and hence the invention should be limited only by the scope of the appended claims.

What is claimed is:

1. A bipolar to two-level binary code translator comprising, a pair of Schmitt trigger circuits both arranged to be in a first stable state if their inputs are positive and in a second stable if their inputs are zero or negative, means to apply bipolar code to-be-translated directly to one of said trigger circuits and to the other of said trigger circuits via an inverter, means to combine the outputs of both said trigger circuits to form a two-level code, said translator further including a buffer circuit connected to the output of each of said trigger circuits for isolation purposes and wherein said means to combine the outputs of said trigger circuits comprises a combining resistor connected to the outputs of both of said buffer circuits.

2. The circuitry of claim 1 further including a third Schmitt trigger circuit having its input connected to said combining resistor and being arranged to trigger at a voltage approximately halfway between the two nominal voltage levels appearing across said combining resistor.

3. A bipolar to two-level code translator comprising, an input terminal, a first Schmitt trigger circuit and an inverter connected to said input terminal, a second Schmitt trigger circuit connected to the output of said inverter, buffer amplifiers connected to the outputs of both of said trigger circuits, the outputs of both of said buffer amplifiers being connected to a single combining resistor via diodes, said two-level binary code appearing across said combining resistor.

4. The circuit of claim 3 further including a third Schmitt trigger having its input connected to said combining resistor, the output thereof providing a substantially noise-free two-level binary code.

References Cited

UNITED STATES PATENTS

| | | | |
|---|---|---|---|
| 3,213,294 | 10/1965 | Okuda | 307—264 X |
| 2,700,149 | 1/1955 | Stone | 328—119 X |
| 3,187,196 | 6/1965 | Corbell et al. | 307—290 X |
| 3,188,486 | 6/1965 | Favin | 307—261 |
| 3,336,485 | 8/1967 | Scarpa | 307—290 X |

JOHN S. HEYMAN, *Primary Examiner.*

U.S. Cl. X.R.

328—118, 119; 307—290; 178—68; 340—347